US006132850A

United States Patent [19]
Hermansen et al.

[11] Patent Number: 6,132,850
[45] Date of Patent: Oct. 17, 2000

[54] REWORKABLE, THERMALLY-CONDUCTIVE ADHESIVES FOR ELECTRONIC ASSEMBLIES

[75] Inventors: Ralph D. Hermansen, Northridge; Richard F. Davis, La Habra; E. Dean Johnston, Fullerton, all of Calif.

[73] Assignee: Raytheon Company, Lexington, Mass.

[21] Appl. No.: 08/755,938

[22] Filed: Nov. 25, 1996

[51] Int. Cl.[7] ........................................ B32B 5/16
[52] U.S. Cl. .............................................. 428/206
[58] Field of Search ............................ 156/330; 428/206

[56] References Cited

U.S. PATENT DOCUMENTS

| | | | |
|---|---|---|---|
| 3,242,116 | 3/1966 | Becker et al. | 156/330 X |
| 3,385,744 | 5/1968 | Van Sciver, II | 156/330 X |
| 3,395,105 | 7/1968 | Washburn et al. | 156/330 X |
| 3,406,053 | 10/1968 | Jaenicke | 156/330 X |
| 3,481,823 | 12/1969 | Sayer et al. | 156/330 X |
| 3,719,724 | 3/1973 | Freeman | 156/330 X |
| 3,811,183 | 5/1974 | Cellig | 156/330 X |

Primary Examiner—Francis J. Lorin
Attorney, Agent, or Firm—Colin M. Raufer; Leonard A. Alkov; Glenn H. Lenzen, Jr.

[57] ABSTRACT

An adhesive and method for attaching a heat sink to a printing wiring assembly that provides a thermal path from electronic components on the printing wiring assembly to the heat sink. The adhesive is flexible and accommodates thermal expansion stresses and is readily reworkable. The adhesive comprises a filler material that is disposed between the heat sink and the printing wiring assembly, and an impregnant that impregnates the filler material, which impregnated filler material is cured. The filler material may comprise alumina particles that have a spherical shape. The impregnant comprises a polymer, typically selected from a group of epoxy resins and their curatives that form a flexible material when cured. In practicing the method, a heat sink is positioned adjacent to and spaced apart from a printing wiring assembly to provide an appropriate spacing between them. The periphery of the printing wiring assembly is sealed. A cavity that is formed between the heat sink and the printing wiring assembly is filled with a filler material. The filled assembly is vibrated to maximize packing density of the filler material. The filler material is then impregnated with a flexible epoxy impregnant. The impregnant is then cured to form the flexible adhesive. This produces a structure wherein the heat sink is bonded to the printed wiring assembly.

10 Claims, 2 Drawing Sheets

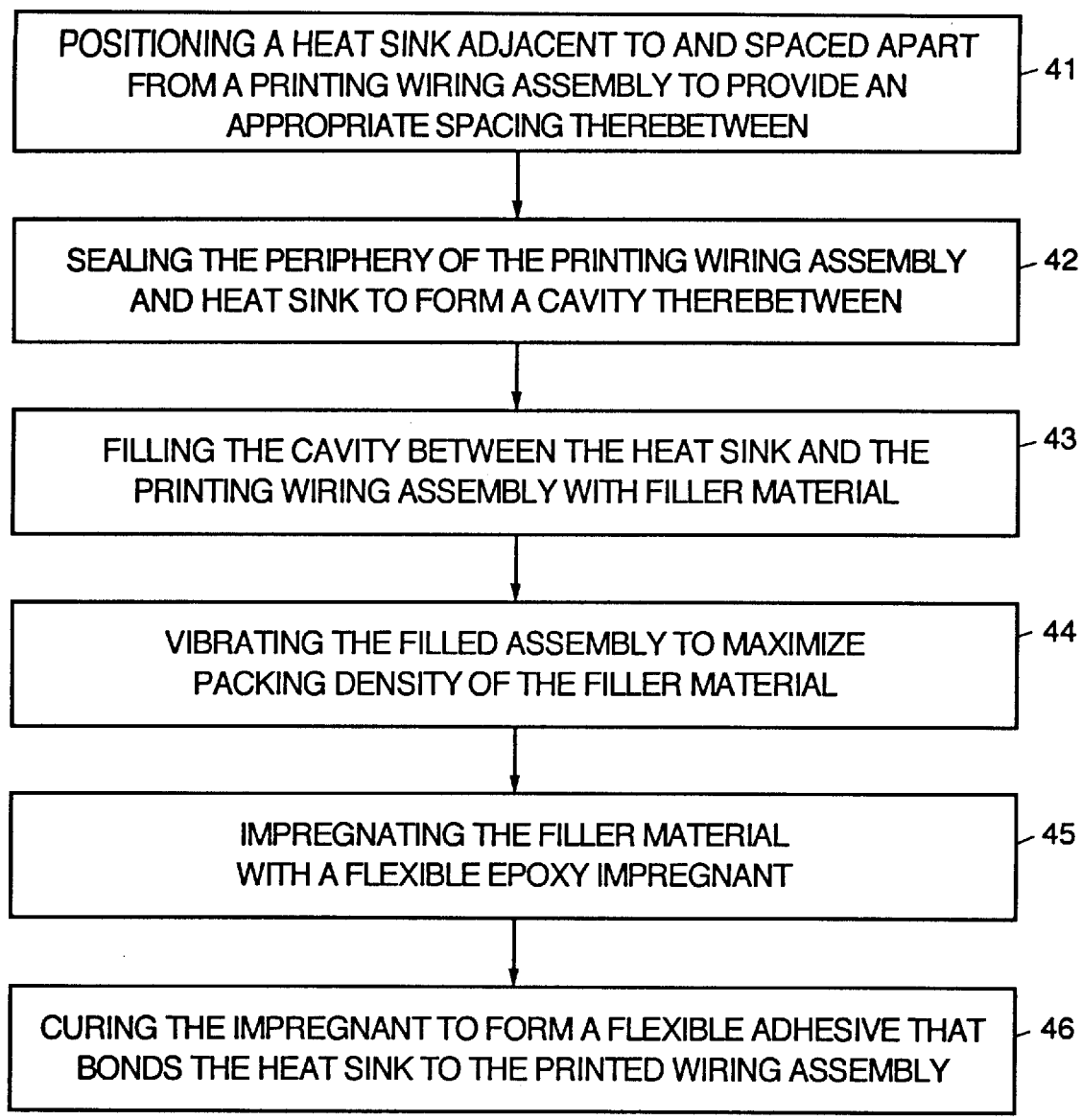

REWORKABLE, THERMALLY-CONDUCTIVE ADHESIVES FOR ELECTRONIC ASSEMBLIES

BACKGROUND

The present invention relates generally to bonding of electronic assemblies, and the like, and more particularly, to reworkable, thermally-conductive adhesives and bonding processes for use in fabricating electronic assemblies.

One prior art bonding method relating to the present invention is to pour or trowel prefilled thermal transfer adhesive (prefilled compounds) into cavities of printed wiring assemblies. The problems with the prior art method are that the friction of the prefilled compound can dislodge circuitry and connections causing open circuits and other electrical and thermal problems. Prefilled compounds have a high loading of inorganic filler, such as alumina particles, for example. Forcing the compound into tight spaces may cause damage to the printed wiring assembly. The need for high thermal conductivity attained by high filler content is directly opposed by the need for low friction (attained by lower filler levels). The applications for which the present assignee is concerned tend to require bonding materials that exhibit a high level of thermal conductivity. This means that the filler loading needs to be as high as it can be. Prefilled adhesives have a lower filler content that makes them flowable and such materials tend to trap voids and air bubbles which lower thermal conductivity of the bonded printed wiring assemblies.

Accordingly, it is an objective of the present invention to provide for reworkable, thermally-conductive adhesives and bonding processes for use in fabricating electronic assemblies. It is a further objective of the present invention to provide for reworkable, thermally-conductive adhesives that have higher thermal conductivity compared with prior art adhesives.

SUMMARY OF THE INVENTION

To meet the above and other objectives, the present invention provides for an adhesive and a method using the adhesive for attaching heat sinks to a printing wiring assembly that provides a thermal path from electronic components of the printing wiring assembly to the heat sink. Moreover, the method is gentle on components and interconnections of the printing wiring assembly. The present adhesive is flexible enough to accommodate thermal expansion stresses and is readily reworkable.

The present method includes the following steps. A heat sink is positioned adjacent to and spaced apart from a printing wiring assembly to provide an appropriate spacing between them. The periphery of the printing wiring assembly is sealed. A cavity that is formed between the heat sink and the printing wiring assembly is filled with a filler material. The filled assembly is vibrated to maximize packing density of the filler material. The filler material is then impregnated with a flexible epoxy impregnant. The impregnant is then cured to form a flexible adhesive. This produces a structure wherein the heat sink is bonded to the printed wiring assembly.

The present invention thus provides an adhesive and method for attaching a metal heat sink to a printed wiring assembly such that the heat generated by the components of the printed wiring assembly is transferred quickly to the heat sink by way of the adhesive. Additional requirements of the adhesive are that it is deformable to reduce stresses caused by thermal expansion mismatch of the materials being bonded together, that it is reworkable, in that the adhesive must be strong enough to survive in application and weak enough to facilitate disassembly, and that it is a good dielectric material.

The present invention provides an improvement over existing bonding methods and materials for various reasons. The filling method generates no stresses on components or interconnections. The present invention achieves higher thermal conductance between the heat sink and the printed wiring assembly compared with prior art adhesives. This alleviates stresses caused by different thermal coefficients. The adhesive is formulated to be weak to facilitate rework and removal. The adhesive is flexible at low temperatures, and the adhesive has good dielectric properties.

The present invention may be used with electronics used in torpedoes, missiles, radar systems, and optoelectronic packages, such as those manufactured by the assignee of the present invention. Each of these applications typically have size restrictions, and cost reduction and effective heat transfer are important. The present invention offers a common solution to these problems.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 3 is a flow chart illustrating a preferred method in accordance with the principles of the present invention of attaching a heat sink to a printing wiring assembly.

DETAILED DESCRIPTION

Figure 1:
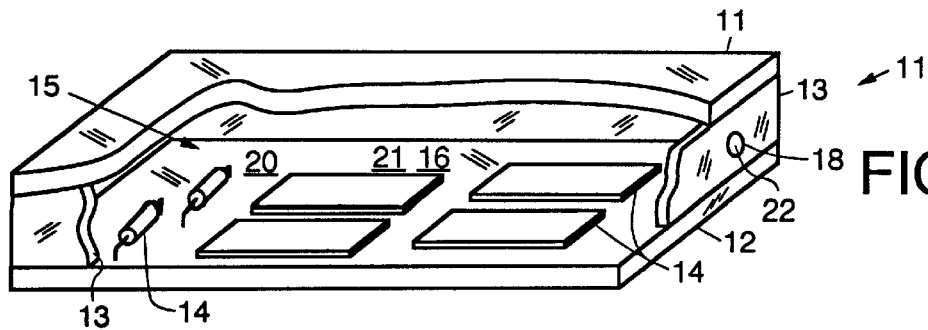
FIG. 1 illustrates a heat sink and printing wiring assembly.
Figure 2:
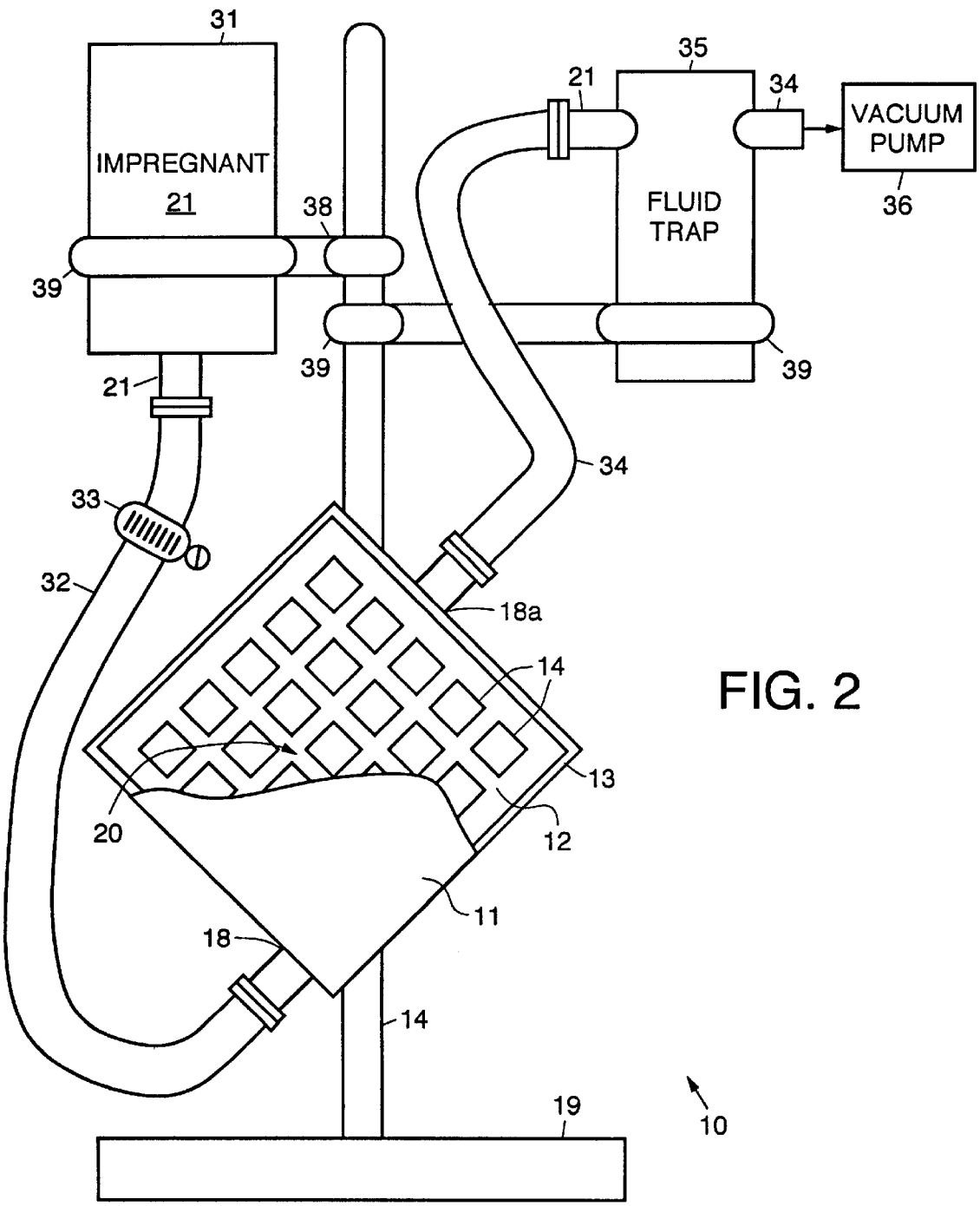
FIG. 2 illustrates apparatus in accordance with the principles of the present invention for attaching a heat sink to a printing wiring assembly.

Referring to the drawing figures, FIG. 1 illustrates the structure of the assembled heat sink 11 and printing wiring assembly 12. The apparatus 10 is used to implement a method 30 of attaching a heat sink 11 to a printing wiring assembly 12 whose various steps and aspects will be generally described below. FIG. 2 illustrates apparatus 10 in accordance with the principles of the present invention for attaching the heat sink 11 to the printing wiring assembly 12 or printed wiring board 12. After this description, FIG. 3 will be discussed which depicts a flow chart illustrating a preferred method 30 in accordance with the principles of the present invention.

Referring to FIGS. 1 and 2, the present invention provides for a generic solution to the problem of removing heat from electronic devices disposed on the printed wiring board 12. The typical printed wiring board 12 is populated with electronic devices 14 or components 14 such as hybrids, flat-bodied components, diodes, resisters, and capacitors, and the like. The topology of the components 14 on the printed wiring board 12 is that of a three-dimensional surface. The heat sink 11 comprises metal, such as aluminum, which is located as close to this surface of the printed wiring board 12 as possible without touching it. The metal heat sink 11 may be formed to correspond to the topology of the printing wiring assembly 12.

The perimeter of the metal heat sink 11 substantially matches the perimeter of the printed wiring assembly 12 and a gasket 13 is disposed therebetween and is used to provide an airtight seal between them. In some applications, both sides of the printed wiring board 12 are populated with components 14, and thus a metal heat sink 11 is provided for each side of the printed wiring board 12 along with gaskets 13 for sealing both sides.

A filler 16 is deposited into a cavity 15 formed between the heat sink 11, the gasket 13 and the surface of the printed wiring board 12 through a port hole 18. The filler 16 is selected to have high thermal conductivity, high electrical resistance, an ability to flow and pack without generating voids, and the ability to be impregnated with an impregnant 21. Spherical shaped particles that comprise the filler 16 have been determined to best meet the flow, packing, and impregnation requirements when compared to other shapes. The size of a largest sphere is determined by the smallest gap that is to be filled within the cavity 15. The relationship between size of the gap and diameter of the sphere was developed experimentally during the course of development of the present invention. It was found that gaps as small as 5 mils between flat areas can be filled with 65 micron particles. It is possible to obtain a void-free impregnation of this filler 16 with a 100 centipoise impregnating compound. Spherical alumina is a filler 16 of choice.

The filler 16 is packed as densely as possible in the cavity 15 to maximize thermal conductivity between the components 14 on the printed wiring board 12 and the heat sink 11. A vibrating table 19 may be used during the filling operation and typically for a short time (on the order of one or two minutes afterwards). The port hole 18 is then sealed with a porous material 22 that holds the filler 16 in place. Wire mesh or glass fabric or glass wool are examples of porous materials 22 suitable for this purpose.

The materials selected for use as the impregnant 21 have been found suitable for impregnation and to have the properties desired for numerous applications of the present invention. A family of polymers selected for use as the impregnant 21 include epoxy resins and their curatives which yield a flexible material when cured.

The viscosity of the combined resin and curative (polymer) is chosen to be low enough to impregnate the filler 16. A small filler 16 (44 micron, for example) can be impregnated with an impregnant 21 having a 50 centipoise viscosity. Work life is defined as the time required for the mixed resin and curative to rise 50% in viscosity. Heating the resin and curative mixture to reduce viscosity is acceptable if the work life at that temperature is long enough to accomplish impregnation of the filler 16. The resin or curative should not boil under vacuum.

The epoxy resins and curatives are selected to yield a soft flexible material when cured. Materials exhibiting a Shore A hardness of 35 or lower are adequately reworkable and flexible. The glass transition temperature of the cured resin and curative material should be below 5 degrees Celsius. The volume resistivity of the combined resin and curative should be in excess of 1000 megaohm-cm. The dielectric constant of the combined resin and curative should be below 6.0.

Formulations for three impregnants 21 which are suitable as low impedance fillers are listed in Table 1.

TABLE 1

| Formulation | Shore A (initial) | Shore A (heat aged) | Viscosity (initial) | Viscosity (1 Hr) |
|---|---|---|---|---|
| 100 pbw Epon 871 + 6.8 pbw Dytek A | 35 | 69 | 400 | 470 |
| 100 pbw EpiRez 505 + 28 pbw DP 3680 | 20 | 33 | 600 | 900 |
| 100 pbw EpiRez 505 + 4.8 pbw Dytek A | 18 | 32 | 550 | 800 |

Slower reacting impregnants 21 using methane diamine and other sterically-hindered cycloaliphatic diamine curatives may also be employed.

The impregnation of the filler 16 can be performed with or without the use of a vacuum. The process is faster using a vacuum pump 36, but the printing wiring assembly 12 must be leak-tight to avoid drawing air bubbles into the cavity 15. FIG. 2 shows a setup for vacuum impregnation of the filler 16. A reservoir 31 of liquid impregnant 21 is positioned above the printing wiring assembly 12 using a suitable clamp 38 holding fixture 39, for example, and a fill line 32 is coupled to the fill port 18 of the printing wiring assembly 12 which is located at a low point thereof. An adjustable clamp 33 on the fill line 31 may be used to regulate the fill rate if necessary. A vacuum line 34 may be coupled to a high point of the printing wiring assembly 12. A fluid trap 35 may be placed in the vacuum line 34 using a suitable clamp 38 holding fixture 39, for example, to prevent liquid impregnant 21 from being drawn into the vacuum pump 36.

The timing and best orientation of impregnation for a particular printing wiring assembly 12 can be experimentally determined during a trial stage by substituting transparent plastic for the metal heat sink 11. The fill rate and fill pattern may then be observed and documented. A safety factor may be added to the impregnation time for production parts.

Curing of the adhesive comprising the combined resin and curative will now be described. The cure temperature and cure time depends on the particular formulation of the impregnant 21. The three formulations listed in Table 1 cure in 1–2 days at room temperature, or within 2 hours at 100 degrees Celsius.

The present invention was developed to complement the inventions disclosed in U.S. Pat. Nos. 5,161,092 and 5,309,320 that are assigned to the assignee of the present invention to enable commercial circuit cards that use convection cooling to be used in conduction cooled environments. This is achieved using the present invention by converting the means for removing heat from the commercial circuit cards to metal heat sinks 11 that employ thermal conduction. The design concepts associated with the present invention follow the approach described in the above-cited patents with the intent to develop a heat removal solution for use in high thermal stress environments which can be utilized in many different applications.

The present invention provides a unique way in which a variety of thermally conductive polymers can be formulated and applied to provide enhanced thermal conduction and high stress performance within an enclosure described in the above-cited patents. The present invention provides for increased thermal conductivity through higher surface area contact, increased component structural support, increased thermal conductivity through utilization of high thermally conductive materials, adaptability to component height and location variability, and circuit card repairability.

The process of filling an enclosed circuit card assembly 12 with thermally conductive particles prior to encapsulation allows more of the particles to come in direct contact with components 14 of the circuit card assembly 12. Complete top and bottom surfaces, sides, and exposed leads of the components 14 are caused to be in contact with the heat sink 11. This higher percentage of surface contact enables greater thermal transfer to the heat sink 11.

In comparison, the use of a conventional premolded elastomer makes good contact on the top side of the components 14, but, side contact and component lead contact is not fully achievable due to location variability of the components 14. Contact with the underside of the components 14 is also not be possible using a conventional premolded elastomer.

In high shock and vibration environments, a surrounding circuit card enclosure transfers energy through the elastomer to the components 14 and solder leads which affect solder joint integrity. The present invention allows impregnated filler material 15 to be deposited beneath the components 14, thereby providing stain relief reinforcement for the solder joints.

Use of a conventional premolded elastomer may cause high stress on the leads for taller components 14. The premolded elastomer tends to be the thinnest in areas over the tallest components 14, and thickest over areas of the circuit board that have no components. This results in different spring rates over different areas of the printed wiring board 12 with the highest amount of the enclosure deflection energy transmitted through the taller components 14. Without component underside support, shock and vibration energy is transferred through the component leads and may cause solder joint failures.

The present process of filling the circuit card assembly 12 allows more thermal conducting material 15 to be used when compared to using a premixed material. Through the use of small particles with the proper aspect ratio, a very high fill percentage is achieved, minimizing the amount of the lower conductivity binding encapsulant that is used. High compaction may be facilitated by using the vibrating table 19, which is somewhat ineffective using prefilled elastomer.

The present invention also allows the use of bulk materials 15 having higher thermal conductivity compared to only using commercially available materials. A test demonstration was conducted using glass beads simulating the use of alumina particles. Use of higher thermally conductive compounds such as boron-nitride may also be used.

Component specifications allow features to vary from lot to lot, which can result in varying the height of the components 14 off the board. Component lead forming also has a certain variability, which is performed by a manufacturer that may not be concerned over tight controls in areas that do not impact convectively cooled circuit cards. Side to side component location on the printed wiring board 12 also has variability. This results in components 14 having height variations that need to be compensated for in the die when using a premolded elastomer. A premolded elastomer may not be able to provide the proper contact pressure required when contacting a component 14 with a minimum height profile while not inducing excessive stresses when contacting components 14 with maximum height profiles. High thermally conductive materials tend to have a higher Shore hardness and require high contact pressures to achieve specified performance. A harder material will not yield as easily over higher components 14 thereby inducing stresses into the component leads. A premolded elastomer designed to compensate for maximum height components 14 may not provide adequate contact pressure on minimum height components 14 to allow for effective heat transfer. The present invention provides positive contact with all components 14 over the full range of variation.

The binding polymer used in the present invention is viscous and flows through the voids between the conducting particles to eliminate air pockets and provide stability for the material 15. A key feature is the low adhesion of the binding polymer. Test samples were made that demonstrate the ease of which the encapsulating compound made of binding polymer and conducting particles can be separated away from components 14 on the printed wiring board 12. Typical printed wiring boards 14 developed by the assignee of the present invention for which the present encapsulation process is to be used cost more than $5000 and not disposable. The present method 30 allows these high cost circuit cards 12 to be repaired with minimal labor effort and costs.

Thus, reworkable, thermally-conductive adhesives and bonding processes for use in fabricating electronic assemblies have been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A reworkable, thermally-conductive adhesive for attaching a heat sink to a printing wiring assembly, said adhesive comprising:

a filler material disposed between the heat sink and the printing wiring assembly, the filler material having a spherical shape to permit dense packing between the printing wiring assembly and the heat sink so as to maximize thermal conductivity therebetween; and an impregnant that impregnates the filler material, the impregnant having a Shore A hardness of 35 or lower and, when cured, a glass transition temperature below 5 degrees Celsius;

and wherein the impregnated filler material is cured to form the reworkable, thermally-conductive adhesive.

2. The adhesive of claim 1 wherein the filler material comprises alumina particles.

3. The adhesive of claim 1 wherein the filler material comprises spherical shaped alumina particles.

4. The adhesive of claim 1 wherein the impregnant comprises a polymer.

5. The adhesive of claim 1 wherein the polymer is selected from a group of epoxy resins and their curatives that form a flexible material when cured.

6. The adhesive of claim 5 wherein the impregnant has a relatively low viscosity.

7. The adhesive of claim 1 wherein the impregnant has a volume resistivity in excess of 1000 megaohm-cm.

8. The adhesive of claim 1 wherein the impregnant has a dielectric constant below 6.0.

9. The adhesive of claim 1 wherein the impregnant includes a sterically-hindered cycloaliphatic diamine curative.

10. The adhesive of claim 9 wherein the curative comprises methane diamine.

* * * * *